United States Patent
Ballantine et al.

(10) Patent No.: US 6,339,022 B1
(45) Date of Patent: Jan. 15, 2002

(54) METHOD OF ANNEALING COPPER METALLURGY

(75) Inventors: Arne W. Ballantine, Coldspring, NY (US); Edward C. Cooney, III, Jericho; George A. Dunbar, III, Essex Junction, both of VT (US); Cheryl G. Faltermeier, Lagrange, NY (US); Jeffrey D. Gilbert, Burlington, VT (US); Ronald D. Goldblatt, Yorktown Heights, NY (US); Nancy A. Greco; Stephen E. Greco, both of Lagrangeville, NY (US); Frank V. Liucci, Wappingers Falls, NY (US); Glenn Robert Miller, Essex Junction; Bruce A. Root, Westford, both of VT (US); Andrew H. Simon, Fishkill, NY (US); Anthony K. Stamper, Williston, VT (US); Ronald A. Warren, Essex Junction, VT (US); David H. Yao, Essex, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/475,712

(22) Filed: Dec. 30, 1999

(51) Int. Cl.⁷ .............................................. H01L 21/44
(52) U.S. Cl. ........................ 438/660; 438/663; 438/687
(58) Field of Search ................................ 438/687, 660, 438/663

(56) References Cited

U.S. PATENT DOCUMENTS

| 3,951,710 A | 4/1976 | Basi |
| 4,789,648 A | 12/1988 | Chow et al. |
| 5,614,444 A | 3/1997 | Farkas et al. |
| 5,676,587 A | 10/1997 | Landers et al. |
| 5,746,947 A | 5/1998 | Vanderpool et al. |
| 6,043,153 A * | 3/2000 | Nogami et al. ............. 438/687 |
| 6,046,108 A * | 4/2000 | Liu et al. .................... 438/687 |
| 6,071,808 A * | 6/2000 | Merchant et al. ........... 438/687 |
| 6,096,652 A * | 8/2000 | Watts et al. ................. 438/692 |
| 6,180,523 B1 * | 1/2001 | Lee et al. .................... 438/687 |
| 6,181,013 B1 * | 1/2001 | Liu et al. .................... 257/762 |

OTHER PUBLICATIONS

'Selective Chemical–Mechanical Polishing Process for Removal of Copper', IBM Technical Disclosure Bulletin, vol. 36, No. 02, Feb. 1993, p.171.

'Alkaline Formulations for Chemical Mechanical Polishing of Copper Utilizing Azole Passivation', IBM Technical Disclosure Bulletin, vol. 37, No. 10, Oct. 1994, p. 187.

Luo, et al., 'Chemical–Mechanical Polishing of Copper in Acidic Media', CMP–MIC Conference, Feb. 22–23, 1996, 1996, ISMIC—100P/96/0145, pp. 145–151.

A. Braun, 'Thermal Processing Options Focus and Specialize', May 1999, Semiconductor International, pp. 56–64.

Gutmann, et al., 'Chemical–mechanical polishing of copper with oxide and polymer interlevel dielectrics', Thin Solid Films 270 v (Dec. 1, 1995) pp. 596–600.

* cited by examiner

Primary Examiner—John F. Niebling
Assistant Examiner—Lynne Gurley
(74) Attorney, Agent, or Firm—Howard J. Walter, Jr.

(57) ABSTRACT

A method for increasing the production yield of semiconductor devices having copper metallurgy planarized by a chemical-mechanical planarization process which includes a slurry that contains a conductor passivating agent, like benzotriazole, wherein a non-oxidizing anneal is used to remove any residue which might interfere with mechanical probing of conductive lands on the substrate prior to further metallization steps. The anneal may be performed by any of several techniques including a vacuum chamber, a standard furnace or by rapid thermal annealing.

25 Claims, No Drawings

METHOD OF ANNEALING COPPER METALLURGY

BACKGROUND OF THE INVENTION

1. Field of the Invention

This invention relates to semiconductor device manufacturing and particularly to the manufacturing of metallurgy for interconnecting elements in integrated circuit devices wherein particular efforts are directed to increasing the yield of semiconductor devices.

2. Background of the Invention

In the manufacture of semiconductor integrated circuit devices the metallurgy which interconnects semiconductor devices is of great importance. As circuit densities become greater the importance of low resistivity interconnects becomes critical. Recently, copper has begun to replace aluminum as the conductor of choice. Copper exhibits lower susceptibility to electromigration failure as compared to aluminum.

Because of the difficulty in defining fine lines in integrated circuit designs, the use of Chemical-Mechanical-Planarization (CMP) has become the process of choice by circuit manufacturers. CMP technology, as described in U.S. Pat. No. 4,789,648 to Chow et al. requires that a recess be formed in a dielectric layer, a conductor is deposited within the recess and its adjacent regions and the excess conductor is removed by a CMP process. Dual Damascene is described as the process in which an entire level of conductive metallurgy, lateral troughs and vertical vias, is formed using a single deposition followed by a single planarization step.

Despite the fact that copper-based metallurgy has certain advantages over aluminum-based metallurgy, copper has certain negative aspects which need to be dealt with in order to develop a manufacturable copper metallurgy process. One of the drawbacks of copper is its ability to diffuse rapidly through standard semiconductor insulators and into silicon causing "poisoning" of pn junctions and failure of integrated circuits. To avoid this problem it is necessary to provide extensive diffusion barriers which entirely surround the copper conductors.

Another difficulty faced by copper-based metallurgy lies in the lack of a self-passivating oxide as found in aluminum-based metallurgy. Copper-based metallurgy cannot be exposed for extended periods of time to oxidizing atmospheres without jeopardizing the integrity of interconnections.

Metallurgy levels in semiconductor technology must meet two requirements, one, it must connect vertically between a semiconductor and another level of metal or between two different levels of metal and, two, it must interconnect two or more points in a plane laterally. The conductive portions of the metallurgy are normally formed in an matrix of dielectric insulator.

In the well known dual Damascene technology, both vertical (vias) and lateral (troughs) are defined sequentially in the intermetal insulator prior to the deposition or formation of any conductive layers. Techniques exist for via first and for trough first dual Damascene processing. Once the insulator has been patterned, copper can be formed by any preferable method such as chemical vapor deposition or electroplating. The amount of deposited copper is determined by that which can completely fill all of the vias and troughs. Since these deposition techniques are substantially conformal processes a certain amount of excess copper is formed which must be removed in order to delineate the metallurgy as isolated units.

The preferred process for removal of excess copper is that of Chemical-Mechanical Planarization or CMP as described in U.S. Pat. No. 4,789,648 to Chow et al., issued Dec. 6, 1988 and numerous subsequent references. CMP of metal layers requires a polishing tool and a slurry which is usually chemically reactive with the metal. The article "Chemical-mechanical polishing of copper with oxide and polymer interlevel dielectrics," R. J. Gutman et al., *Thin Solid Films*, Vol. 270, No. 1–2, Dec. 1, 1995, pp. 596–600 describes slurries for CMP of copper including nitric acid based slurries.

Although it is desirable to provide a coplanar metal conductor/insulator surface, CMP technology has two primary and competitive process detractors: dishing and erosion. Dishing is the phenomenon in which wide areas of polished copper are over polished creating a dish-like depression in the surface of the copper. Too much dishing causes failures in copper lines. Erosion is the phenomenon in which the intermetal dielectric is caused to be eroded allowing too much copper to be removed. Dishing is a function of line width while erosion is a function of the density of lines. In a typical semiconductor circuit the thickness of the conductive layers are on the order of a single micron or on the order of 1/70th of the thickness of ordinary paper.

As suggested in the above article, the addition of a film-forming organic reagent can be added to a slurry in order to protect the copper from the chemical environment of the slurry. Benzotriazole (BTA) is a known copper surface passivation agent. When BTA is added to an acid-based slurry, a non-native surface film is formed which inhibits the etching of copper in low lying regions. This surface film forms a passivating organic layer on the surface of the copper which keeps the copper from oxidizing.

SUMMARY OF THE INVENTION

It has been found in the manufacturing of dual Damascene copper metallurgy that certain known practices create problems in consistently providing high yield of product wafer particularly where frequent testing is required at intermediate levels of metallurgy. A significant number of failures have been observed by the inventors when attempts have been made to probe semiconductor chips polished in slurries using BTA as a passivating agent. While probe pressure was adequate to penetrate the passivation film is many cases, the number of failures attributed to high resistance two-point probes was unacceptable.

Accordingly, it is an object to increase the yield of processed wafers containing copper metallurgy.

It is another object of the invention to provide a process which is capable of easy integration into dual Damascene copper technology.

It is yet another object to improve the state of copper metallurgy manufacturing by providing a process which is easily implemented by any number of typically available tools of a semiconductor manufacturing line.

These and other objects are achieved by a simple annealing process which not only eliminates the non-native organic film formed by the presence of BTA in a slurry, but also reduces the amount of oxidation experienced by the exposed, unprotected areas of copper on semiconductor wafers without compromising the ability to probe wafers or to perform subsequent processing steps in a manufacturing environment.

The above objects and other advantages of the invention will become more readily apparent from the following description of the preferred embodiments of the invention.

DETAILED DESCRIPTION OF THE INVENTION

In developing a manufacturable copper Back End Of the Line (BEOL) metallization process, the inventors have discovered that at certain levels of processing where test probing is required to verify characteristics of metal levels that probe results would become irregular if not unacceptable. This is particularly true in a volume manufacturing environment in which hundreds or thousands of wafers are required to be processed.

As described above, in the process of forming a copper dual Damascene structure it is necessary to provide recesses in a dielectric layer which in turn are filled with a copper diffusion barrier or liner followed by deposition of copper. The specific liner material and method of depositing of copper may be selected from any known technique suitable of providing the required characteristics for manufacturing product. Following the deposition of copper, it is necessary to remove excess copper by utilization of a CMP process. In particular, the CMP slurry selected was a nitric acid-based in which the chemical benzotriazole (BTA), sometimes designated as azimidobenzene. BTA is well known as a passivation agent for copper as it provides an adherent surface film relied on in the planarization process to prevent the excess erosion or dishing of copper during the CMP process.

The BTA passivation is only a few atomic layers thick and electrically probing a single copper pad is not a problem. In a manufacturing environment, however, hundreds or thousands of wafers are processed per day, and, since typical wafers have in excess of 1000 copper pads which need to be probed, a wafer tester can probe millions of copper pads per day. During the implementation of high volume manufacturing testing, the inventors discovered that approximately 0.1–1% of the copper pads probed had poor probe contact yields, which resulted in an increase in the probe-to-copper-pad contact resistance. This increased contact resistance resulted in an increase in parametric variability and, in some cases, increased wafer scrap due to out of specification electrical parameters. The cause of the poor probing on 0.1%–1% of the copper pads is not fully understood but it is believed to be related to variation in probe pressure or probe cleanliness. Note that manufacturing probe testers use probe cards with hundreds or thousands or probes in each card and it is extremely difficult to independently verify the probe pressure and cleanliness of each individual probe tip. The inventors have discovered if the BTA was removed prior to probing the copper pads, the incidence of high probe contact resistance and poor probe contact yield decreased to much less than 0.1%.

Following the CMP process semiconductor wafers are cleaned to remove excess slurry and any residual grit or other foreign matter which may contaminate the surfaces of the wafers. Any commercial post CMP cleaning process is deemed effective.

The inventors have discovered that following the cleaning, it is necessary to anneal the processed wafers in a non-oxidizing atmosphere at a temperature between 100° and 700° C. for a time period ranging from about 1 to 60 minutes in order to maximize product yield at probe testing. "Non-oxidizing" can be any environment which does not promote oxidation and can include vacuum environments where the partial pressure of oxygen is extremely low. Non-oxidizing can also include a reducing environment including one containing hydrogen, nitrogen or ammonia. It is believed that the annealing aids in removal of non-native organic residue not removed by the post-CMP cleaning process.

While annealing can be attributed to removal of organic compounds, if the wafers are permitted to be exposed to an oxidizing atmosphere such as ambient conditions, excessive oxidation can occur which can be more detrimental to yield than the original passivation film.

In order to make the invention useful for the largest number of applications and situations, several preferred embodiments of the invention will now be described.

In the first embodiment, post-CMP copper dual Damascene wafers are annealed in a processing tool which is capable of providing both the required non-oxidizing atmosphere as well as the required temperature. Any number of commercially available existing physical vapor deposition (PVD) and/or plasma enhanced chemical vapor deposition (PECVD) tools meet this need quite well.

A typical anneal process would include the steps of placing wafers within the pump down chambers of a tool an providing a vacuum of about 50 mTorr to 2 Torr and there after heating wafers to about 325° to 370° C. a time of about 2–4 minutes. The preferable conditions are 350° C. for 3 minutes. After the anneal, pressure can be allowed to return to room temperature at a normal rate for the particular tool. Since the vapor pressures of any normal atmospheric gases present in the vacuum chamber are so low, no special conditions are believed to be necessary to further create the required "non-oxidizing" atmosphere.

Another annealing environment can be a conventional bulk furnace comprising a standard quartz walled tube furnace. Here, because of the long heat up and cool down times required, it is only necessary to use a temperature of between 100° C. and 275° for between 10 and 75 minutes. The preferable conditions are 260° C. for 20 minutes. Because the furnace operates at atmospheric pressure, it is necessary to artificially exclude oxygen by the use of a nitrogen gas environment. It is important that the non-oxidizing atmosphere be maintained until the wafer temperature cools to less than about 125° C. to prevent excessive atmospheric oxidation which might be caused by oxygen in room air.

Yet another, and the preferred, embodiment is to utilize a Rapid Thermal Processor (RTP) to provide the most efficient and lowest cost of ownership for the process. Here Rapid Thermal Annealing (RTA) is implemented in nitrogen under the following conditions: using a thermal ramp up rate of about 50° C. per second up to about 425° C., hold for about 45 seconds and cool down at about 60° C. per second to a temperature of about 125° C., again to avoid excessive atmospheric oxidation in room ambient conditions.

The choice of any one of the embodiments for actual use in a manufacturing environment, will be dependent on the availability of existing tool sets available within a manufacturing facility. For new plant or line applications the RTP method is clearly preferable.

Those skilled in the art will understand and appreciate that the benefits of the invention can be successfully achieved by slight variations in the specific temperature ranges and other parameters specified above.

For example, the operating conditions necessary to remove other non-native organic films from the surface of metallurgy may vary depending upon the physical characteristics of the films as other organic materials other than BTA may also have the capability of providing a non-native passivation film on copper metallurgy.

What we claim is:

1. The method of manufacturing semiconductor devices containing inlaid metallurgy containing metal-based conductors not subject to self-passivation comprising the steps of:

depositing metal-based conductors on a semiconductor substrate;

coplanarizing said metal-based conductors and an insulator in a chemical environment comprising a passivating agent which prevents excessive removal of said metal-based conductors; and exposing said planarized substrate to a non-oxidizing annealing atmosphere in order to volatilize any reaction products of said passivating agent and said metal-based conductors.

2. The method of claim 1 wherein the intermediate step of cleaning the coplanarized metal-based conductors follows the step of coplanarizing.

3. The method of claim 1 wherein said metal-based conductors comprise copper.

4. The method of claim 3 wherein said passivating agent comprises a triazole.

5. The method of claim 4 wherein said triazole comprises benzotriazole (BTA).

6. The method of claim 1 wherein said coplanarization step comprises a chemical-mechanical planarization (CMP) step.

7. The method of claim 6 wherein said CMP step comprises the use of a slurry comprising nitric acid.

8. The method of claim 1 wherein said insulator comprises an oxide of silicon.

9. The method of claim 1 wherein said non-oxidizing annealing atmosphere comprises an environment of sub-atmospheric pressure.

10. The method of claim 9 wherein said sub-atmospheric pressure is about 50 mTorr.

11. The method of claim 1 wherein said non-oxidizing annealing atmosphere comprises an environment of increased temperature in a range of about 100° C. to about 425° C.

12. The method of claim 11 wherein said non-oxidizing annealing atmosphere comprises an environment of increased temperature for a time period of between about 45 seconds to about 75 minutes.

13. The method of claim 1 wherein said non-oxidizing annealing atmosphere comprises an environment of a vacuum chamber at a pressure of about 50 mTorr at a temperature of between about 325° C. to about 370° C. for about 2 to about 4 minutes.

14. The method of claim 13 wherein said non-oxidizing annealing atmosphere comprises an environment of a vacuum chamber at a temperature of about 350° C. for about 3 minutes.

15. The method of claim 1 wherein said non-oxidizing annealing atmosphere comprises an environment comprises a furnace at a temperature between about 100° C. and about 275° C. for a time period of between about 10 minutes to about 75 minutes.

16. The method of claim 15 wherein said non-oxidizing annealing atmosphere comprises an environment comprises a furnace at a temperature of about 260° C. for about 20 minutes.

17. The method of claim 15 wherein said non-oxidizing annealing atmosphere comprises an environment includes a step of allowing said substrate to cool to a temperature below that at which said metal-based conductor oxidizes readily in ambient room atmosphere.

18. The method of claim 17 wherein said non-oxidizing annealing atmosphere comprises an environment in which said cool down step allows said substrate to cool to about 125° C.

19. The method of claim 1 wherein said non-oxidizing annealing atmosphere comprises an environment including rapid thermal annealing at a temperature of about 425° C. for about 45 seconds.

20. The method of claim 19 wherein said non-oxidizing annealing atmosphere comprises an environment in which the thermal ramp up rate is about 50° C. per second.

21. The method of claim 19 wherein said non-oxidizing annealing atmosphere comprises an environment in which the thermal ramp down rate is about 60° C. per second.

22. The method of claim 19 wherein said non-oxidizing annealing atmosphere comprises an environment which is sustained until said substrate cools to a temperature below that of about 125° C.

23. The method of claim 1 wherein said substrate contains previously deposited layers of conductors.

24. The method of claim 1 wherein said exposing step is performed before said substrate is probed.

25. The method of claim 1 wherein said non-oxidizing atmosphere comprises nitrogen.

* * * * *